United States Patent [19]

Laakmann

[11] Patent Number: 5,008,894
[45] Date of Patent: Apr. 16, 1991

[54] DRIVE SYSTEM FOR RF-EXCITED GAS LASERS

[75] Inventor: Peter Laakmann, Seattle, Wash.

[73] Assignee: Synrad, Incorporated, Bothell, Wash.

[21] Appl. No.: 502,231

[22] Filed: Mar. 30, 1990

[51] Int. Cl.$^5$ .............................. H01S 3/0975
[52] U.S. Cl. ........................ 372/38; 372/81; 372/82
[58] Field of Search ............ 372/81, 82, 83, 38, 372/55, 87

[56] References Cited

U.S. PATENT DOCUMENTS

| | | | |
|---|---|---|---|
| 4,169,251 | 9/1979 | Lackmann | 372/83 X |
| 4,363,126 | 12/1982 | Chenausky | 372/38 |
| 4,373,202 | 2/1983 | Laakmann et al. | 372/64 |
| 4,455,658 | 6/1984 | Sutter, Jr. | 372/38 |
| 4,493,087 | 1/1985 | Laakmann et al. | 372/82 X |
| 4,710,941 | 12/1987 | Sluss et al. | 372/87 |
| 4,805,182 | 2/1989 | Laakmann | 372/82 |
| 4,837,772 | 6/1989 | Laakmann | 372/82 |
| 4,849,981 | 7/1989 | Toda | 372/38 |

Primary Examiner—Frank Gonzalez
Assistant Examiner—Galen J. Hansen
Attorney, Agent, or Firm—Seed and Berry

[57] ABSTRACT

A system for improved drive and matching between an RF power source and a plasma tube in a laser system. The system uses standard 50 or 75 ohm quarter wave transmission lines as the sole interconnect and matching elements between discharge electrodes and drive transistors. The drive transistos may be operated in deep saturation or as switches providing near square wave output to approach the 100 percent theoretical electrical efficiency of switching power supplies. The system features better initial breakdown, bettwer discharge uniformity and power stability under narrow drive pulse conditions, lower matching electrical losses, and extreme simplicity and low cost.

19 Claims, 3 Drawing Sheets

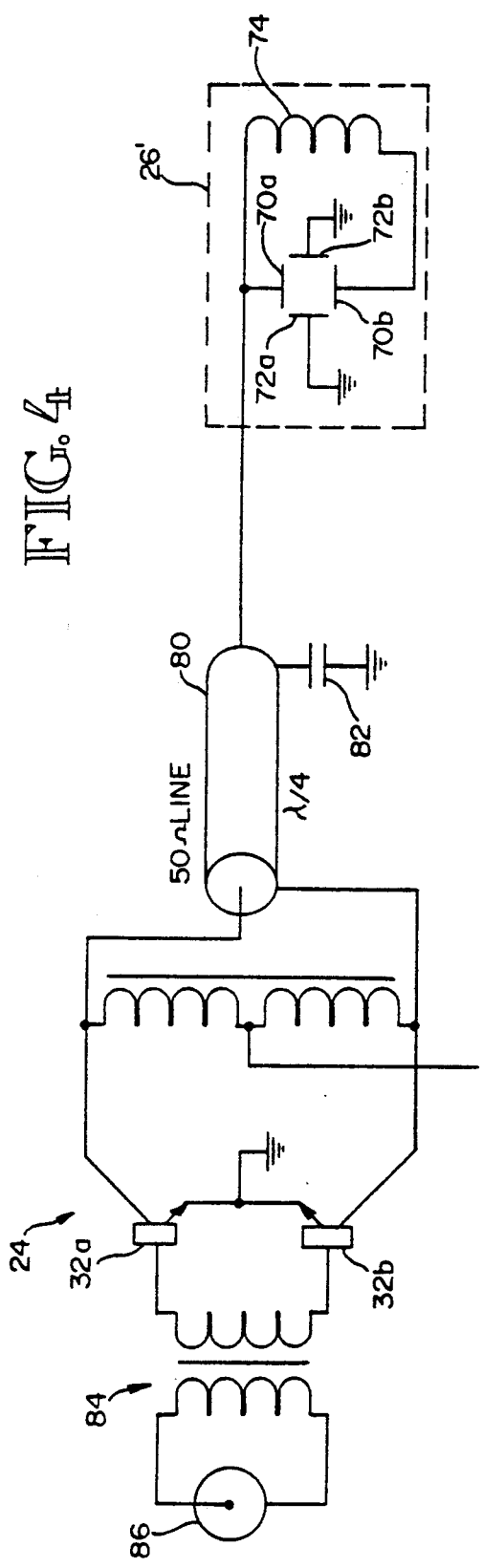
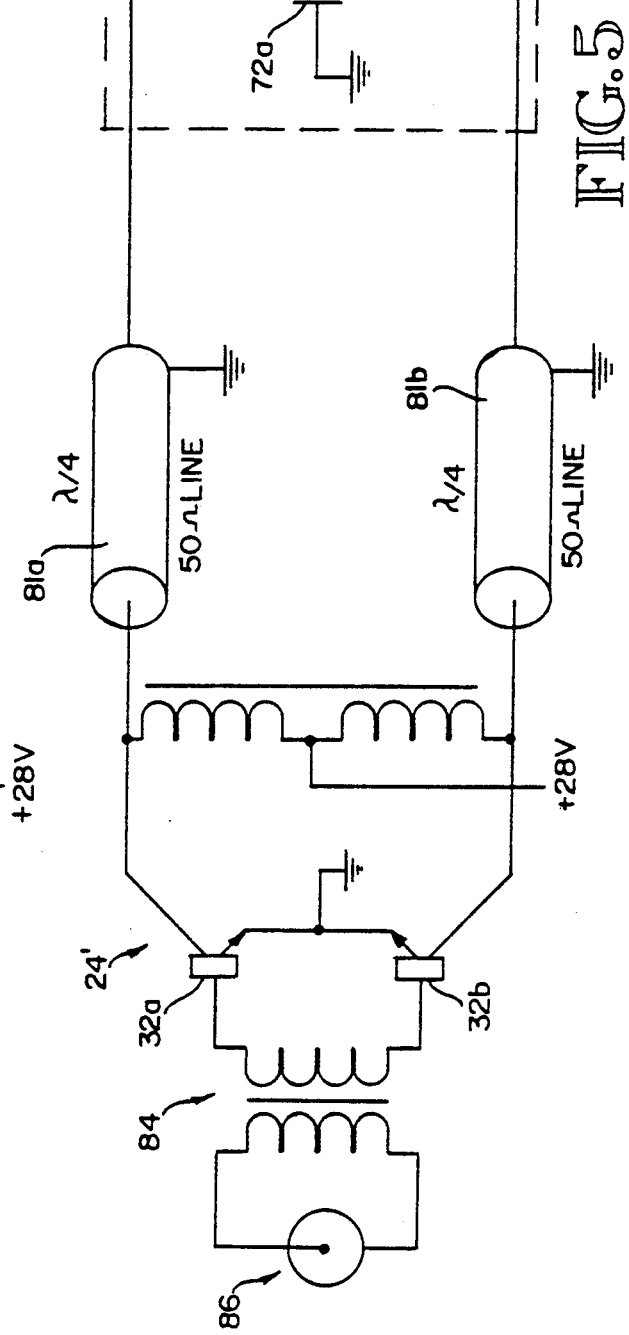

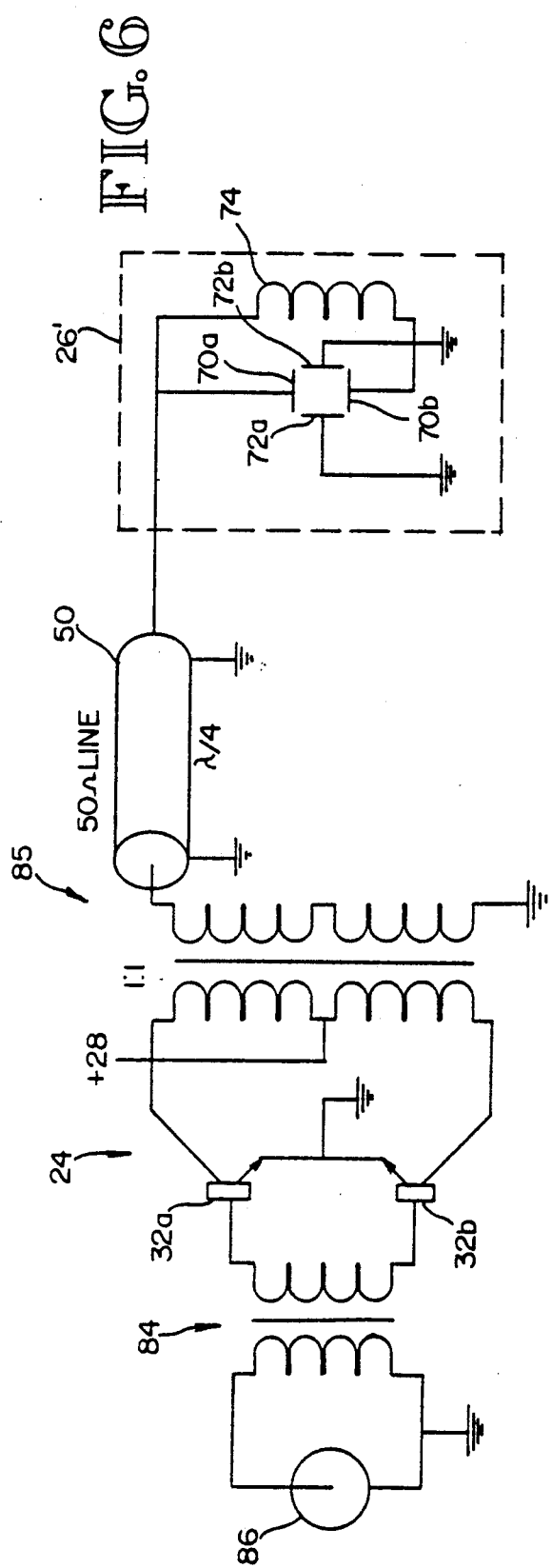

DRIVE SYSTEM FOR RF-EXCITED GAS LASERS

TECHNICAL FIELD

This invention relates generally to gas lasers and more particularly to matching and drive systems for transversely excited gas lasers.

BACKGROUND OF THE INVENTION

Interconnection and matching of an RF excited gas laser to an RF generator is typically accomplished by the use of a 50 ohm coaxial transmission line with separate matching networks at both ends. The matching network at the laser end usually steps up the line impedance to a range between several hundred and several thousand ohms, while the matching network at the RF generator end steps the line impedance down to the low values required for the generator's transistor output stage. Other functions of the matching networks are to account for the two different impedance values of the plasma tube, before and after breakdown. Yet another function of the matching network is to cancel reactive components at source and load. U.S. Pat. No. 4,455,658 by Sutter, U.S. Pat. No. 4,169,251 by Laakmann and U.S. Pat. No. 4,363,126 by Chenausky et al. are typical examples of such interconnect systems.

An exception to these standard techniques is taught by Laakmann in U.S. Pat. No. 4,837,772. In this disclosure a lumped constant matching system is used directly between the RF generator's output stage transistors and the laser. No interconnect cables are used, for reasons disclosed there. However, the main feature of that disclosure is the "self-oscillating technique" that eliminated much of the complexity of matching drive frequency and laser as well as accounting for the two different impedance states of the plasma contained within the laser's plasma tube.

In U.S. Pat. No. 4,373,202 by Laakmann, et al., the technique is disclosed of using a 75 ohm quarter wave transmission line within a 50 ohm system to automatically adjust power in order to decrease "hot spots" within the plasma tube and provide a more stable discharge. However, both laser and power source are still matched to 50 ohm impedances and produce sinusoidal waveforms.

SUMMARY OF THE INVENTION

The present invention provides a matching system between a source of RF energy and a laser tube which is simple in design while also providing a very good match.

In general, the invention is an RF excited gas laser system. The laser system comprises a plasma tube, a voltage source of RF energy, and a transmission line. The plasma tube has an electrical input port, a discharge section and means for outcoupling laser energy. The plasma tube produces laser energy upon ignition of a gas contained within the plasma tube. The input terminal has a real impedance at a predetermined operating frequency. The voltage source of RF energy has a source impedance much lower than the plasma tube impedance at the operating frequency. The transmission line is connected at an input end to the voltage source and at an output end to the plasma tube. It has an electrical length substantially equal to an odd number of quarter wavelengths at the operating frequency and has a characteristic impedance (with the plasma ignited) intermediate the impedance of the voltage source and the impedance of the plasma tube.

In one embodiment, the drive source of the laser system is balanced and the load due to the laser system is unbalanced. In this case, the transmission line is coaxial and is used to convert from the balanced source to the unbalanced load. In another embodiment, the drive source, transmission line and laser system load are all balanced. In either embodiment the drive source may be a square wave. In a further embodiment, the balanced transmission line comprises two coaxial cables having substantially equal lengths.

BRIEF DESCRIPTION OF THE DRAWINGS

FIG. 4 is a schematic diagram of a first embodiment of the invention, including a quarter wave transmission line connected between a balanced pair of output transistors and an unbalanced laser load.

FIG. 5 is a schematic diagram of a third embodiment of the invention, including two quarter wave transmission lines of FIG. 4 and further including a 1:1 isolation transformer.

FIG. 6 is a schematic diagram of a second embodiment of the invention, including the quarter wave transmission line of FIG. 4 and further including a 1:1 isolation transformer.

DETAILED DESCRIPTION OF THE INVENTION

Figure 1:
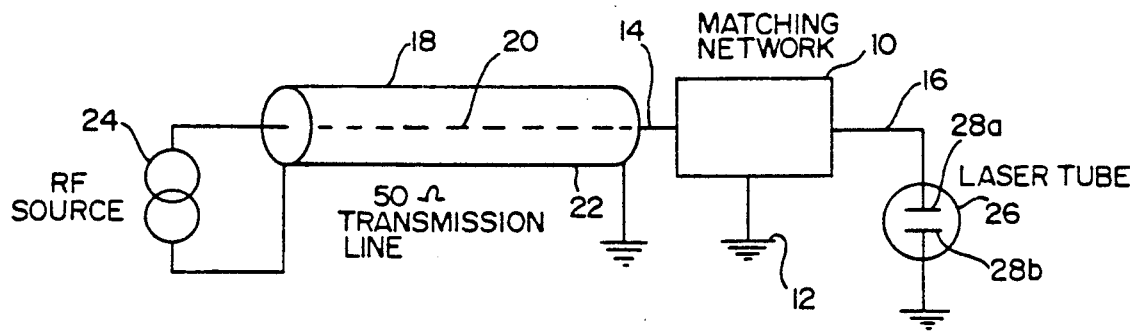
FIG. 1 is a schematic diagram of a conventional matching network known in the prior art, connected between a gas laser and an RF generator.

FIG. 1 is a schematic diagram of a conventional matching network 10 known in the prior art, connected between a gas laser and an RF (radio frequency) generator. The matching network 10, which can be grounded to electrical ground 12, has an input 14 and an output 16. The input 14 is connected to an output end of an inner conductor 20 of a transmission line 18. An outer shield 22 of the transmission line 18 is electrically grounded at the transmission line's output end. An input end of the transmission line 18 is connected to an RF source 24. One side of the RF source 24 is connected to the center conductor 20 of the transmission line 18 and the other side of the RF source 24 is connected to the outer shield 22 of the transmission line 18. The output 16 of the matching network 10 is connected to a laser tube 26 of a gas laser. The laser tube 26 includes at least two electrodes 28a and 28b which transversely excite a lasing gas mixture contained within the laser tube 26 through the application of an RF voltage across the electrodes 28a and 28b.

Figure 2:
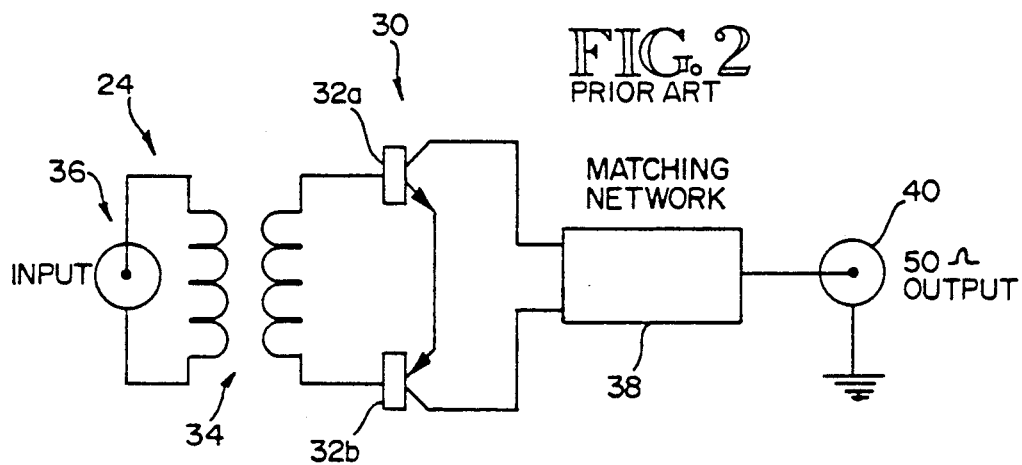
FIG. 2 is a schematic diagram of the final stage of a conventional RF generator known in the prior art.

FIG. 2 is a schematic diagram including a final stage 30 of a broadband RF source 24 known in the prior art. The final stage 30 operates at 28 volts DC and uses two transistors 32a and 32b operating in a push-pull configuration. The voltage drops due to the transistors 32a and 32b are usually negligible. As is well known in the art, a transformer 34 is used to match the impedance of the final stage 30 to an input 36. The final stage 30 is connected to a matching network 38 within the RF source 24 to match the impedance of the final stage 30 to the desired impedance at the output 40. A 50 ohm output is conventional for an RF generator.

Figure 3:
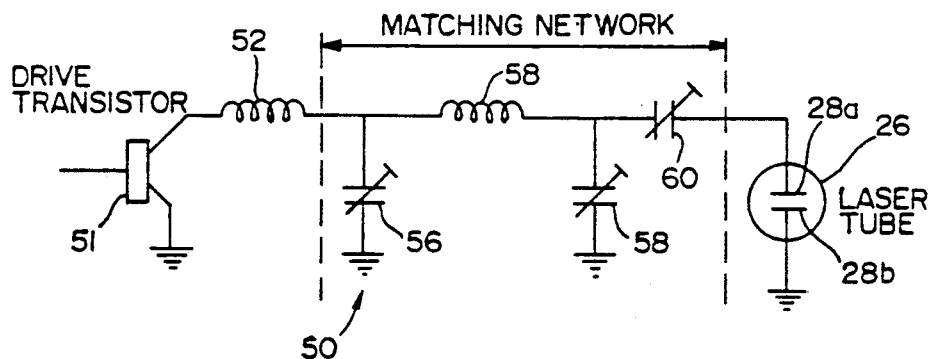
FIG. 3 is a schematic diagram of a lumped constant matching network known in the prior art.

FIG. 3 is a schematic diagram of a lumped constant matching network 50 known in the prior art. It represents one way of matching the impedance of a drive transistor 51 to the impedance of the electrode 28a of the laser tube 26. In this laser configuration, the electrode 28b is electrically grounded. The matching network 50 includes inductors 52 and 54 and adjustable capacitors 56, 58 and 60 to perform the desired impedance-matching operation.

FIG. 4 is a schematic diagram of a first embodiment of the invention, which provides for simpler impedance matching between a source 24' and a laser or plasma tube 26'. The laser tube 26' differs from the laser tube 26 in that it includes two pairs of electrodes, pairs 70a-70b and 72a-72b. The electrodes are arranged in a square configuration with the electrodes of each pair of electrodes positioned diametrically opposite each other within the laser tube 26'. Electrode 70a is connected to the output of the RF source 24 through the impedance-matching circuit to be described subsequently, and electrode 70b is connected to electrode 70a through an inductance coil 74. Both of electrodes 72a and 72b are electrically grounded.

A transmission line 80 is directly connected between the collectors of the transistors 32a and 32b and electrode 70a of laser tube 26'. An outer shield 80a of the transmission line 80 is connected to the collector of transistor 32b and to ground through a blocking capacitor 82 at the laser tube end of the transmission line since it carries DC voltage, as inner conductor 80b of the transmission line 80 is connected to the collector of transistor 32a.

The coil 74 shown is disclosed in U.S. Pat. No. 4,837,772. The coil 74 serves the purpose of neutralizing capacitive reactance and generating bi-phase excitation, as explained in said U.S. patent. The transmission line 80 typically has a 50 ohm nominal impedance and has an electrical length of a quarter wave. Accordingly, at the typical excitation frequency of 45 MHz it has a physical length of about 130 centimeters due to the velocity factor of the transmission line's dielectric.

The impedance (R) of the electrodes 70a of the laser tube 26' averages about 200 ohms when the laser tube 26' is lit, as disclosed by U.S. Pat. No. 4,805,182. This assumes that the laser tube 26' has a square bore of 4.8 millimeters, contains a laser gas at a pressure of 60 torr and has discharge electrodes that are 37 centimeters long. These laser tube parameters are appropriate for a gas laser operating at resonance with an input power of about 110 W. In a $CO_2$ laser this corresponds to a continuous wave (CW) laser output power of about 15 W. This value of the impedance R corresponds to an electrode-to-electrode impedance of 800 ohms. The impedance of the discharge section of the laser tube 26' is several thousand ohms in the non-ignited state. (These impedances are measured unsymmetrically.) However, the impedance R depends on power delivered. It is lower with higher input power. The input power of 110 W corresponds to the maximum laser output power.

In a second aspect of the invention, the signal driving the pair of transistors 32a and 32b is derived from a crystal controlled or variable frequency generator through a transformer 84, as shown in the schematic diagram of FIG. 6. It may also be derived by connecting a feedback path between laser tube 26' and an input 86 as taught by U.S. Pat. No. 4,837,772.

The transistors 32a and 32b can be operated in class B or AB to produce near sinusoidal voltage outputs with negligible saturation drops as is well known in RF amplifier design. The collector-to-collector RMS voltage between the transistors 32a and 32b is therefore essentially two times the supply voltage and the required load resistance to deliver a power P is $R = V^2/P$. For the indicated parameters this load resistance is 14.3 ohms. As is well known in the art, a quarter wave transformer to match the two impedances must have characteristic impedance (Z) equal to the geometric mean of $Z/r = R/Z$.

According to the theoretical load relationship given above, to deliver 110 W, the push-pull stage has peak-to-peak output voltage of 56 V or 39.5 V RMS. The corresponding load impedance is 14.3 ohms. Thus, the impedance Z of a quarter wave line to match the two impedances has to satisfy the expression: $Z/14.3 = 200/Z$. An impedance Z of approximately 53 ohms satisfies this. This is close enough to standard values of transmission lines (approximately 50 ohms) to make this invention realizable.

For the indicated parameters, this value of impedance Z calculates to 53 ohms. This is a very fortunate circumstance as this value is close enough to the value of commercial cables which range between 50 and 53 ohms for most popular sizes. This matching technique then provides further simplification of the already low production cost of the "all-metal" laser technology disclosed in U.S. Pat. No. 4,805,182 and the simple "self oscillating" excitation technology disclosed in U.S. Pat. No. 4,837,772.

Contrary to prior art disclosed in U.S. Pat. No. 4,373,202 by Laakmann, the quarter wave transmission line 50 is used between the RF source 24 and the laser tube 26'. The RF source 24 is represented by the alternately saturated transistors 32a and 32b. Indeed the drive does not have to be a sine wave. The transistors 32a and 32b can be operated in a square wave fashion. Referring to Table 1, no power is delivered to the laser tube 26' or to the transmission line 50 at any odd harmonic. This is so because the laser drive impedance is zero at all frequencies except at the fundamental. The interconnect transmission line 50, however, represents a odd multiple of a quarter wave lengths for all harmonics. Such lines have the same property as a quarter wave transmission line. When terminated with a short, their input impedance is infinite. Therefore no current is delivered to the input of the transmission line 50 (as seen by the transistors 32a and 32b) at any of the harmonics. This represents an ideal load for the transistors 32a and 32b and accounts for the observed high efficiency of this invention. Collector efficiency is a theoretical 100 percent compared to a theoretical 78 percent for class B linear amplifiers. Observed efficiencies are about 75 percent versus 50 percent in the class B amplifiers of the prior art.

TABLE 1

| Harmonic (n) | Square Wave Drive | | Laser Impedance | Transistor Load |
|---|---|---|---|---|
| | Amplitude x 2 VCC | Transmission Line Length λ | | |
| 1 | 4/π | 1/4 | 200 ohms | 14.3 ohms |
| 3 | 4/3π | 3/4 | very low | very high |
| 5 | 4/5π | 5/4 | very low | very high |

The Fourier expansion of a square wave shows terms of 4/nπ where n is the harmonic number. If the drive system is used in a near square wave mode, the fundamental RMS voltage for perfect transistors 32a and 32b and the RF source 24 is $56/\sqrt{(2)} \times 4/\pi = 50.4$ V. Again solving for the load resistance to deliver 110 W results in $r = V^2/P = 23$ ohms. Accordingly, a matching quarter wave transmission line has an impedance of 67.8 ohms. This is close to the impedance of a standard 75 ohm transmission line. Alternately, if a 75 ohm transmission line is used between the 200 ohm load and the switching supply, a power of 90.7 W would be delivered to the laser tube. For a 50 ohm transmission line the power delivered is 203 W. As pointed out earlier, the impedance of the laser tube 26' decreases with increased power. The actual power delivered to a laser tube 26' would be below the actual power that is delivered to a resistive load. Thus, there are enough variables between choices of transmission line 80, waveshape, supply voltage and laser operating conditions to build practical systems over a wide operating range.

The system diagrammed schematically in FIG. 4 uses the transmission line 80 to go between a balanced system (the push-pull transistor pair 32a and 32b) and a ground reference load represented by the laser tube 26'. This is possible since the common mode impedance of a quarter wave transmission line is several hundred ohms at the operating frequency, particularly when coiled up to fit within the laser enclosure. It was not necessary to wind the transmission line 80 around magnetic materials as is done for broadband transmission line transformers well known in the art. Such a transmission line represents a source of radiation that can result in interference to other instruments or communications systems. The transmission line 80 should therefore only be used within a shielded enclosure.

FIG. 5 is a schematic diagram of a third embodiment of the invention, including two quarter wave transmission lines of FIG. 4 and further including a 1:1 isolation transformer. The circuitry shown schematically in FIG. 5 is identical to that shown in FIG. 4 except that the inner conductors of the conventional separate quarter-wave transmission lines 81a and 81b are connected to transistors 32a and 32b, respectively. The outer conductors of the transmission lines 81a and 81b are grounded. The outputs of the quarter-wave transmission lines 81a and 81b are respectively connected to the electrodes 70a and 70b in the laser tube 26'. The electrodes 70a and 70b are connected together via coil 74. The two transmission lines 81a and 81b have substantially equal lengths. If desired, the transmission lines 81a and 81b can be packaged together in a single cable.

FIG. 6 shows a method of overcoming the radiation problem of the embodiment of FIG. 4 by using a balanced to unbalanced (balun) type transformer 85. As is well-known in the art, such transformers can be built very effectively for unity transformation. Such is not the case for step-up or step-down transformers. A typical implementation uses twisted wire wound around a high permeability ferrite core, which is usually toroidal. The close physical proximity and core permeability assure a nearly perfect transformer, particularly for this uncritical narrow band application. The transmission line 80 in this case can be used as an interconnect between shielded enclosures without causing much radiation. All of the advantages and considerations discussed above apply.

A distinct advantage of the disclosed laser system is the ease of laser tube breakdown. The laser tube 26' initially has a high impedance. The drive frequency injected into the input 86 has a frequency close to resonance of the laser tube 26'. The high laser tube impedance is reflected to a very low impedance, typically a few ohms by the inverse transformation property of the quarter wave transmission line 80. The RF source 24 is a voltage source that will cause very high current to flow until breakdown is achieved in the laser tube 26', particularly when operated in square wave fashion. In this context, the definition of a voltage source is one of very low source impedance, when compared to the applied load. The instantaneous peak currents for a few microseconds are far above CW conditions. The amount of power delivered is likewise high. Breakdown is achieved within a few microseconds. After breakdown has occurred, power will self-regulate as taught in U.S. Pat. No. 4,373,202. The high peak currents seen by the transistors 32a and 32b are combined with correspondingly low collector voltages. This is relatively safer than the situation in the prior art when the power delivered during firing is usually less due to mismatch, with high peak voltages on the transistors.

The matching system of this invention has also significantly reduced the incidence of the yet unsolved "dark" effect, where a laser may take several seconds to fire initially after prolonged shut down.

This extremely simple technique has accomplished the following:

(1) Very few parts are necessary in comparison to the existing state-of-the-art designs. Additionally there are no matching adjustments.

(2) The quarter wave transmission line 80 is driven by a voltage source, as represented by the two alternately saturated output transistors 32a and 32b. Extremely high voltages are delivered to the discharge section of the laser tube 26' to accomplish fast breakdown of the laser gas. This helps to produce high speed pulsing as well as to overcome starting difficulties after prolonged shutdown. RF power delivered is highest just prior to breakdown of the gas. In the prior art the RF power delivered is usually less during the ignition phase due to mismatch of the 50 ohm system used.

(3) Automatic power compensation improves discharge stability, as disclosed by U.S. Pat. No. 4,373,202.

(4) Electrical losses are minimal due to the absence of conventional matching networks. Electrical efficiency is about 15 percent better than prior art as described in U.S. Pat. No. 4,837,722. Additional gains in efficiency are the result of using the transistors 32a and 32b as switches, as will be explained in (6) below.

(5) The system 10 can be used with conventional fixed frequency excitation, as well as in a "self-oscillating" scheme as described in U.S. Pat. No. 4,837,772.

(6) The transistors 32a and 32b can be operated in a switching or deep saturation mode with very high efficiency of conversion to sine wave power at the laser tube 26'. This is due to the unique combination of elements when used with the harmonics of a square wave driving voltage. Therefore, no power is delivered by the transistors 32a and 32b except at the fundamental frequency.

Those who are skilled in the art may perceive certain modifications such as changes of active devices, transformer, construction of transmission lines, or other circuit elements, including analogy between series and parallel resonance as taught by U.S. Pat. No. 4,837,772. All such modifications are deemed to be within the scope of the invention which is only to be limited by the following claims:

What is claimed is:

1. An RF excited gas laser system, comprising:
   a plasma tube for producing laser energy upon ignition of a gas contained within, said plasma tube having an electrical input port, a discharge section, an optical resonator and means for outcoupling laser energy from said plasma tube, the input terminal having a real impedance at a predetermined operating frequency;
   a voltage source of RF energy having a source impedance much lower than the plasma tube impedance at the operating frequency; and
   a transmission line connected at an input end to the voltage source and at an output end to the plasma tube, the transmission line having an electrical length substantially equal to an odd number of quarter wavelengths at the operating frequency and having a characteristic impedance intermediate the impedance of said voltage source and the impedance of said plasma tube.

2. The laser system of claim 1 wherein said voltage source produces an output that is substantially symmetrical and has substantially only odd harmonics.

3. The laser system of claim 1 wherein the characteristic impedance of said transmission line is between 20 and 200 ohms.

4. The laser system of claim 1 wherein the impedance of said voltage source is substantially less than the input impedance of said transmission line at the input end with the gas ignited.

5. The laser system of claim 1 wherein said voltage source comprises of a pair of transistors operating in push-pull configuration and being driven substantially into saturation.

6. The laser system of claim 1 wherein said voltage source is balanced and the electrical load of said plasma tube is unbalanced.

7. The laser system of claim 6 wherein said transmission line is coaxial and converts from the balanced source to the unbalanced load.

8. The laser system of claim 6 wherein the transmission line is balanced and converts from the balanced source to the unbalanced load.

9. The laser system of claim 6, further comprising a 1:1 isolation transformer for isolating said transmission line from said voltage source.

10. The laser system of claim 1 wherein said voltage source, said transmission line and the electrical load of said plasma tube are all balanced.

11. The laser system of claim 10 wherein said balanced transmission line comprises two coaxial cables having substantially equal lengths.

12. The laser system of claim 1 wherein said voltage source is an amplifier with an input derived by feedback from said laser tube.

13. The laser system of claim 1 wherein the voltage source produces a substantially square wave.

14. An RF excited gas laser system, comprising:
   a plasma tube for producing laser energy upon ignition of a gas contained within, said plasma tube having an electrical input terminal, a discharge section, an optical resonator and means for outcoupling laser energy from said plasma tube, the input terminal having a real impedance at a predetermined operating frequency;
   a voltage source of RF energy having a source impedance much lower than the plasma tube impedance at the operating frequency; and
   a transmission line connected at an input end to the voltage source and at an output end to the plasma tube, the transmission line having an electrical length substantially equal to an odd number of quarter wavelengths at the operating frequency and having a characteristic impedance between 20 and 200 ohms and intermediate the impedance of said voltage source and the impedance of said plasma tube,
   the impedance of said voltage source being substantially less than the input impedance of said transmission line at the input end with the gas ignited.

15. An RF excited gas laser system, comprising:
   a plasma tube for producing laser energy upon ignition of a gas contained within, said plasma tube having an electrical input terminal, a discharge section, an optical resonator and means for outcoupling laser energy from said plasma tube, the input terminal having a real impedance at a predetermined operating frequency;
   a voltage source of RF energy having a source impedance much lower than the plasma tube impedance at the operating frequency, said voltage source comprising a pair of transistors operating in push-pull configuration and being driven substantially into saturation; and
   a transmission line connected at an input end to the voltage source and at an output end to the plasma tube, the transmission line having an electrical length substantially equal to an odd number of quarter wavelengths at the operating frequency and having a characteristic impedance between 20 and 200 ohms and intermediate the impedance of said voltage source and the impedance of said plasma tube.

16. An RF excited gas laser system, comprising:
   a plasma tube for producing laser energy upon ignition of a gas contained within, said plasma tube having an electrical input terminal, a discharge section, an optical resonator and means for outcoupling laser energy from said plasma tube, the input terminal having a real impedance at a predetermined operating frequency, the electrical load of said plasma tube being unbalanced;
   a voltage source of RF energy having a source impedance much lower than the plasma tube impedance at the operating frequency, said voltage source being balanced; and
   a transmission line connected at an input end to the voltage source and at an output end to the plasma tube, the transmission line having an electrical length substantially equal to an odd number of quarter wavelengths at the operating frequency and having a characteristic impedance between 20 and 200 ohms and intermediate the impedance of said voltage source and the impedance of said plasma tube.

17. The laser system of claim 16 wherein said transmission line is coaxial and converts the balanced source to the unbalanced load.

18. The laser system of claim 16 wherein the transmission line is balanced and converts the balanced source to the unbalanced load.

19. The laser system of claim 16, further comprising a 1:1 isolation transformer for isolating said transmission line from said voltage source.

* * * * *